(12) United States Patent
Surthi et al.

(10) Patent No.: US 12,557,274 B2
(45) Date of Patent: Feb. 17, 2026

(54) METHODS USED IN FORMING A MEMORY ARRAY COMPRISING STRINGS OF MEMORY CELLS INCLUDING SELECTIVELY ETCHING SACRIFICIAL MATERIAL IN A MEMORY-CELL REGION SELECTIVELY RELATIVE TO INSULATING, INSULATOR AND/OR INSULATIVE MATERIAL(S) TO FORM VOID SPACES BETWEEN CONDUCTIVE TIERS

(71) Applicant: Micron Technology, Inc., Boise, ID (US)

(72) Inventors: Shyam Surthi, Boise, ID (US);
Richard J. Hill, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 905 days.

(21) Appl. No.: 17/710,262

(22) Filed: Mar. 31, 2022

(65) Prior Publication Data
US 2023/0320085 A1    Oct. 5, 2023

(51) Int. Cl.
| | | |
|---|---|---|
| *H10B 43/00* | (2023.01) | |
| *H10B 41/10* | (2023.01) | |
| *H10B 41/27* | (2023.01) | |
| *H10B 41/30* | (2023.01) | |
| *H10B 43/10* | (2023.01) | |

(Continued)

(52) U.S. Cl.
CPC ............. *H10B 41/27* (2023.02); *H10B 41/10* (2023.02); *H10B 41/30* (2023.02); *H10B 43/10* (2023.02); *H10B 43/27* (2023.02); *H10B 43/35* (2023.02)

(58) Field of Classification Search
CPC ......... H10B 41/27; H10B 43/27; H10B 43/35
See application file for complete search history.

(56) References Cited

U.S. PATENT DOCUMENTS

| | | | |
|---|---|---|---|
| 2010/0207193 A1* | 8/2010 | Tanaka | H10B 43/27 |
| | | | 257/E21.679 |
| 2018/0277555 A1* | 9/2018 | Fukushima | H01L 21/7682 |

(Continued)

*Primary Examiner* — Anh D Mai
(74) *Attorney, Agent, or Firm* — Wells St. John P.S.

(57) ABSTRACT

A memory array comprising strings of memory cells comprises a vertical stack comprising vertically-alternating insulative tiers and conductive tiers directly above a conductor tier. Channel-material-string constructions of memory-cell strings extend through the insulative and conductive tiers. The channel material of the channel-material-string constructions directly electrically couples with conductor material of the conductor tier. The vertical stack comprising a memory-cell region comprises memory cells. Individual of the insulative tiers in the memory-cell region laterally-outward of the channel-material-string constructions have at least a majority of their insulative matter being void space. The vertical stack comprises an upper region directly above the memory-cell region. The upper region comprises at least two of the conductive tiers and that comprise upper select gates. Individual of the insulative tiers in the upper region laterally-outward of the channel-material-string constructions have at least a majority of their insulative matter being solid. Other embodiments, including method, are disclosed.

12 Claims, 11 Drawing Sheets

(51) Int. Cl.
*H10B 43/27* (2023.01)
*H10B 43/35* (2023.01)

(56) References Cited

U.S. PATENT DOCUMENTS

2020/0005819 A1\* 1/2020 Bellorado ................. H03L 7/07
2021/0399012 A1\* 12/2021 Zhang .................... H10B 43/10

\* cited by examiner

METHODS USED IN FORMING A MEMORY ARRAY COMPRISING STRINGS OF MEMORY CELLS INCLUDING SELECTIVELY ETCHING SACRIFICIAL MATERIAL IN A MEMORY-CELL REGION SELECTIVELY RELATIVE TO INSULATING, INSULATOR AND/OR INSULATIVE MATERIAL(S) TO FORM VOID SPACES BETWEEN CONDUCTIVE TIERS

TECHNICAL FIELD

Embodiments disclosed herein pertain to memory arrays comprising strings of memory cells and to methods used in forming a memory array comprising strings of memory cells.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory-cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semi conductive channel region therebetween. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

Memory arrays may be arranged in memory pages, memory blocks and partial blocks (e.g., sub-blocks), and memory planes, for example as shown and described in any of U.S. Patent Application Publication Nos. 2015/0228651, 2016/0267984, and 2017/0140833. The memory blocks may at least in part define longitudinal outlines of individual wordlines in individual wordline tiers of vertically-stacked memory cells. Connections to these wordlines may occur in a so-called "stair-step structure" at an end or edge of an array of the vertically-stacked memory cells. The stair-step structure includes individual "stairs" (alternately termed "steps" or "stair-steps") that define contact regions of the individual wordlines upon which elevationally-extending conductive vias contact to provide electrical access to the wordlines.

DETAILED DESCRIPTION OF EXAMPLE EMBODIMENTS

Embodiments of the invention encompass methods used in forming a memory array, for example an array of NAND or other memory cells having peripheral control circuitry under the array (e.g., CMOS-under-array). Embodiments of the invention encompass so-called "gate-last" or "replacement-gate" processing, so-called "gate-first" processing, and other processing whether existing or future-developed independent of when transistor gates are formed. Embodiments of the invention also encompass a memory array (e.g., NAND architecture) independent of method of manufacture. Example method embodiments are described with reference to FIGS. 1-14 which may be considered as "gate-last" or "replacement-gate" processing. Further, and regardless, the following sequence of processing steps is but one example and other sequences of the example processing steps (with or without other processing steps) may be used regardless of whether using "gate-last/replacement-gate" processing.

FIGS. 1-4 show a construction 10 having an array or array area 12 in which elevationally-extending strings of transistors and/or memory cells will be formed. Construction 10 comprises a base substrate 11 having any one or more of conductive/conductor/conducting, semi conductive/semi-conductor/semiconducting, or insulative/insulator/insulating (i.e., electrically herein) materials. Various materials have been formed elevationally over base substrate 11. Materials may be aside, elevationally inward, or elevationally outward of the FIGS. 1-4—depicted materials. For example, other partially or wholly fabricated components of integrated circuitry may be provided somewhere above, about, or within base substrate 11. Control and/or other peripheral circuitry for operating components within an array (e.g., array 12) of elevationally-extending strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

A conductor tier 16 comprising conductor material 17 has been formed above substrate 11. An example conductor material 17 is conductively-doped poly-silicon atop tungsten silicide. Conductor tier 16 may comprise part of control circuitry (e.g., peripheral-under-array circuitry and/or a common source line or plate) used to control read and write access to the transistors and/or memory cells that will be formed in array 12.

A vertical stack 18 comprising vertically-alternating insulative tiers 20 (e.g., second tiers) and conductive tiers 22 (e.g., first tiers) is directly above conductor tier 16. Conductive tiers 22 may not be conductive and insulative tiers 20 may not be insulative at this point of processing. The example uppermost tier 20 may be thicker/thickest compared to one or more other tiers 20 and/or 22. Only a small number of tiers 20 and 22 is shown, with more likely stack 18 comprising dozens, a hundred or more, etc. of tiers 20 and 22. Example conductive tiers 22 and insulative tiers 20 comprise different composition materials 26 and 24 (e.g., silicon nitride and silicon dioxide), respectively. Example thickness for each of tiers 20 and 22 is 20 to 60 nanometers.

Channel openings 25 have been formed (e.g., by etching) through insulative tiers 20 and conductive tiers 22 to conductor tier 16. Channel openings 25 may taper radially-inward (not shown) moving deeper in stack 18. In some embodiments, channel openings 25 may go into conductor material 17 of conductor tier 16 as shown or may stop there-atop (not shown). Alternately, as an example, channel openings 25 may stop atop or within the lowest insulative tier 20. A reason for extending channel openings 25 at least to conductor material 17 of conductor tier 16 is to assure direct electrical coupling of channel material to conductor tier 16 without using alternative processing and structure to do so. An additional reason is to provide a bottom anchoring function for material that is formed within channel openings 25. Etch-stop material (not shown) may be within or atop conductor material 17 of conductor tier 16 to facilitate stopping of the etching of channel openings 25 relative to conductor tier 16 when such is desired. Such etch-stop material may be sacrificial or non-sacrificial. By way of example and for brevity only, channel openings 25 are shown as being arranged in groups or columns of staggered rows of four and five openings 25 per row and being arrayed in laterally-spaced memory-block regions 58. In this document, "block" is generic to include "sub-block". Memory-block regions 58 may be considered as being longitudinally elongated and oriented, for example along a direction 55. Any alternate existing or future-developed arrangement and construction may be used.

Example memory-block regions 58 are shown as at least in part having been defined by horizontally-elongated trenches 40 that were formed into stack 18 (e.g., by anisotropic etching). Trenches 40 may be wider than channel openings 25 (e.g., 3 to 10 times wider). Trenches 40 may have respective bottoms that are directly against conductor material 17 (e.g., atop or within) of conductor tier 16 (as shown) or may have respective bottoms that are above conductor material 17 of conductor tier 16 (not shown).

Transistor channel material may be formed in the individual channel openings elevationally along the insulative tiers and the conductive tiers, thus comprising individual channel-material strings, which is directly electrically coupled with conductive material in the conductor tier. Individual memory cells of the example memory array being formed may comprise a gate region (e.g., a control-gate region) and a memory structure laterally between the gate region and the channel material. In one such embodiment, the memory structure is formed to comprise a charge-blocking region, storage material (e.g., charge-storage material), and an insulative charge-passage material. The storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a band gap-engineered structure having nitrogen-containing material [e.g., silicon nitride] sandwiched between two insulator oxides [e.g., silicon dioxide]) is laterally between the channel material and the storage material.

In one embodiment and as shown, charge-blocking material 30, storage material 32, and charge-passage material 34 have been formed in individual channel openings 25 elevationally along insulative tiers 20 and conductive tiers 22. Transistor materials 30, 32, and 34 (e.g., memory-cell materials) may be formed by, for example, deposition of respective thin layers thereof over stack 18 and within individual channel openings 25 followed by planarizing such back at least to a top surface of stack 18 as shown.

Channel material 36 has also been formed in channel openings 25 elevationally along insulative tiers 20 and conductive tiers 22 and comprises individual operative channel-material strings 53 in one embodiment having memory-cell materials (e.g., 30, 32, and 34) there-along. Materials 30, 32, 34, and 36 are collectively shown as and only designated as material 37 in some figures due to scale and in some embodiments may be considered as a channel-material-string construction 95. Example channel materials 36 include appropriately-doped crystalline semiconductor material, such as one or more silicon, germanium, and so-called III/V semiconductor materials (e.g., GaAs, InP, GaP, and GaN). Example thickness for each of materials 30, 32, 34, and 36 is 25 to 100 Angstroms. Punch etching may be conducted as shown to remove materials 30, 32, and 34 from the bases of channel openings 25 to expose conductor tier 16 such that channel material 36 is directly against conductor material 17 of conductor tier 16. Such punch etching may occur separately with respect to each of materials 30, 32, and 34 (as shown) or may occur collectively with respect to all after deposition of material 34 (not shown). Alternately, and by way of example only, no punch etching may be conducted and channel material 36 may be directly electrically coupled to conductor material 17 of conductor tier 16 by a separate conductive interconnect (not shown). Channel openings 25 are shown as comprising a radially-central solid dielectric material 38 (e.g., spin-on-dielectric, silicon dioxide, and/or silicon nitride). Alternately, and by way of example only, the radially-central portion within channel openings 25 may include void space(s) (not shown) and/or be devoid of solid material (not shown).

Vertical stack 18 comprises a memory-cell region 71 comprising memory cells, such memory cells not having been completely fabricated yet in the example gate-last embodiment. Individual of insulative tiers 20 of memory-cell region 71 comprise sacrificial material 24, for example silicon dioxide. In one example gate-last embodiment, conductive tiers 22 in memory cell region 71 (at least some of such region) may be considered as comprising sacrifice material 26 that is of different composition from that of sacrificial material 24. Sacrifice material 26, when present, is also of different composition from that of the at least one of the insulating, insulator, or insulative material of the at least one of the (a), the (b), or the (c), respectively, that is referred to below. Silicon nitride is, an example sacrifice material 26 when sacrificial material 24 is silicon dioxide.

Figure 1:
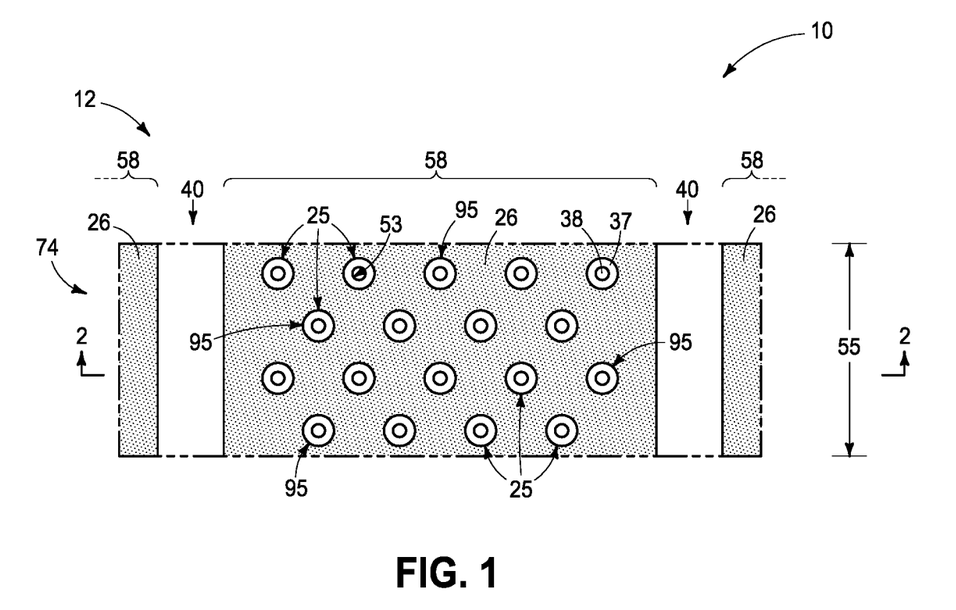
FIGS. 1-4 are diagrammatic cross-sectional views of portions of what will be an array of elevationally-extending strings of memory cells in accordance with an embodiment of the invention.
Figure 2:
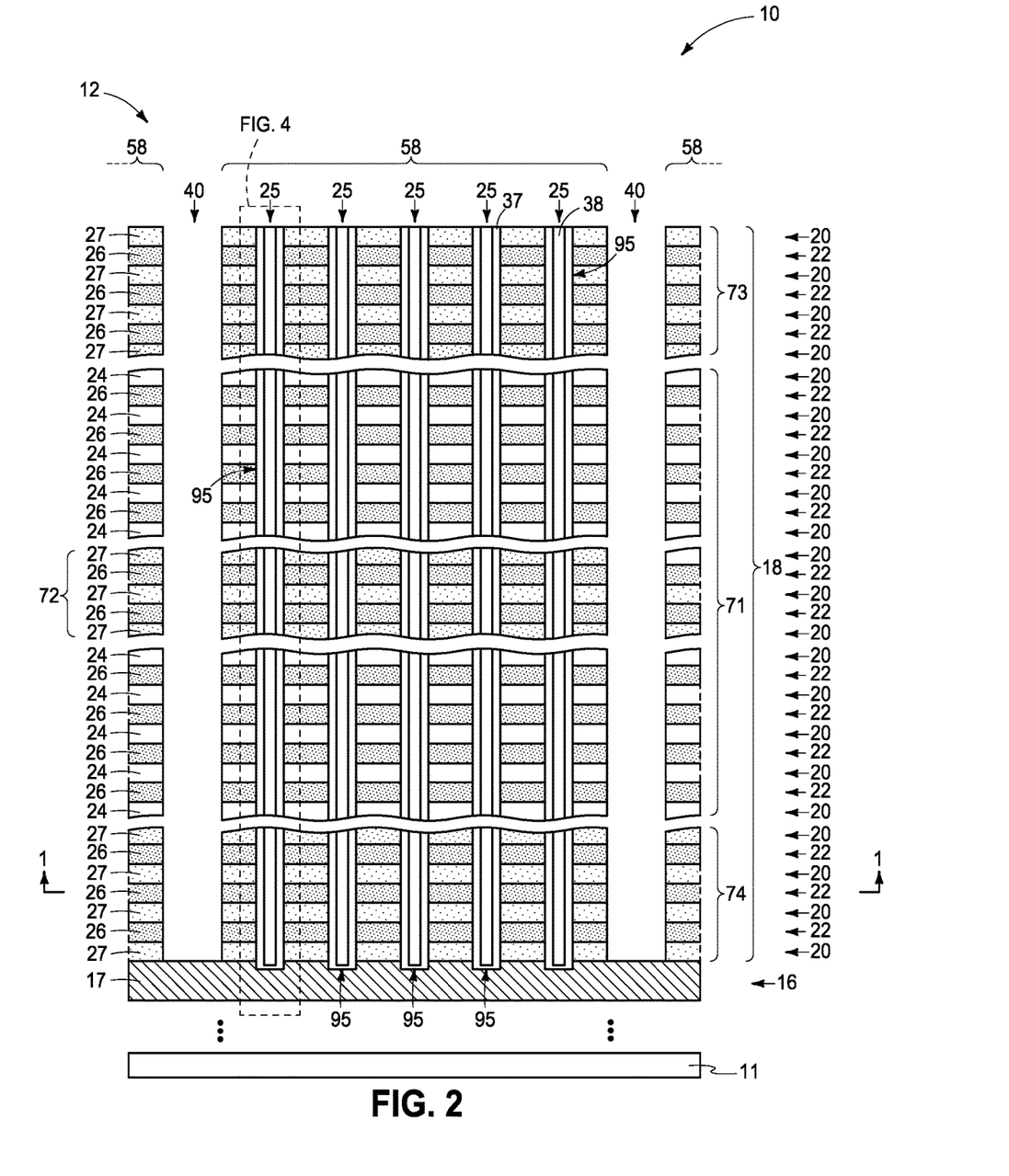
Figure 3:
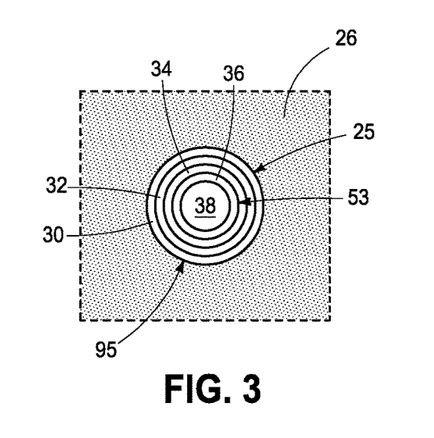
Figure 4:
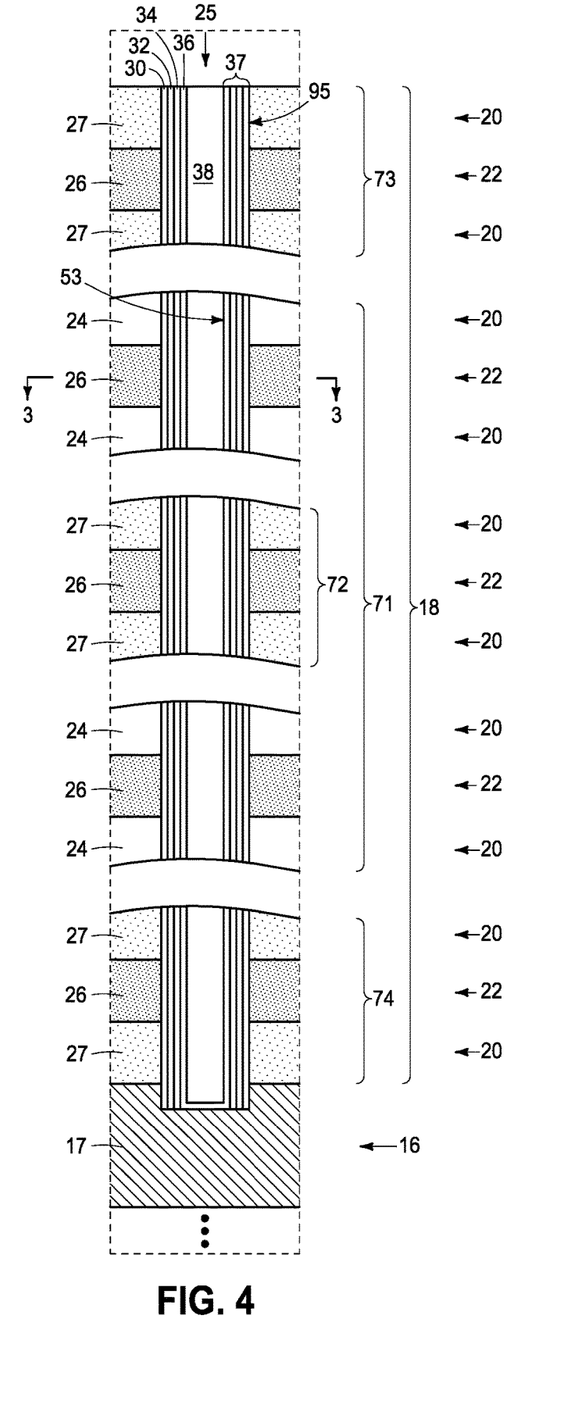
Figure 5:
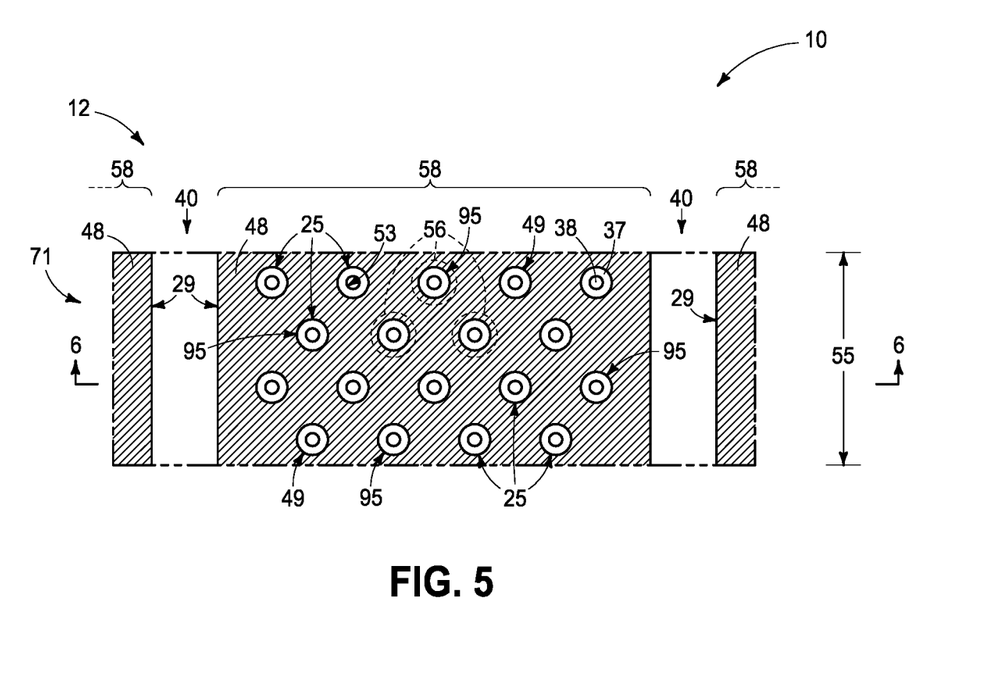
FIGS. 5-14 are diagrammatic sequential sectional and/or enlarged views of the construction of FIGS. 1-4, or portions thereof or alternate and/or additional embodiments, in process in accordance with some embodiments of the invention.
Figure 6:
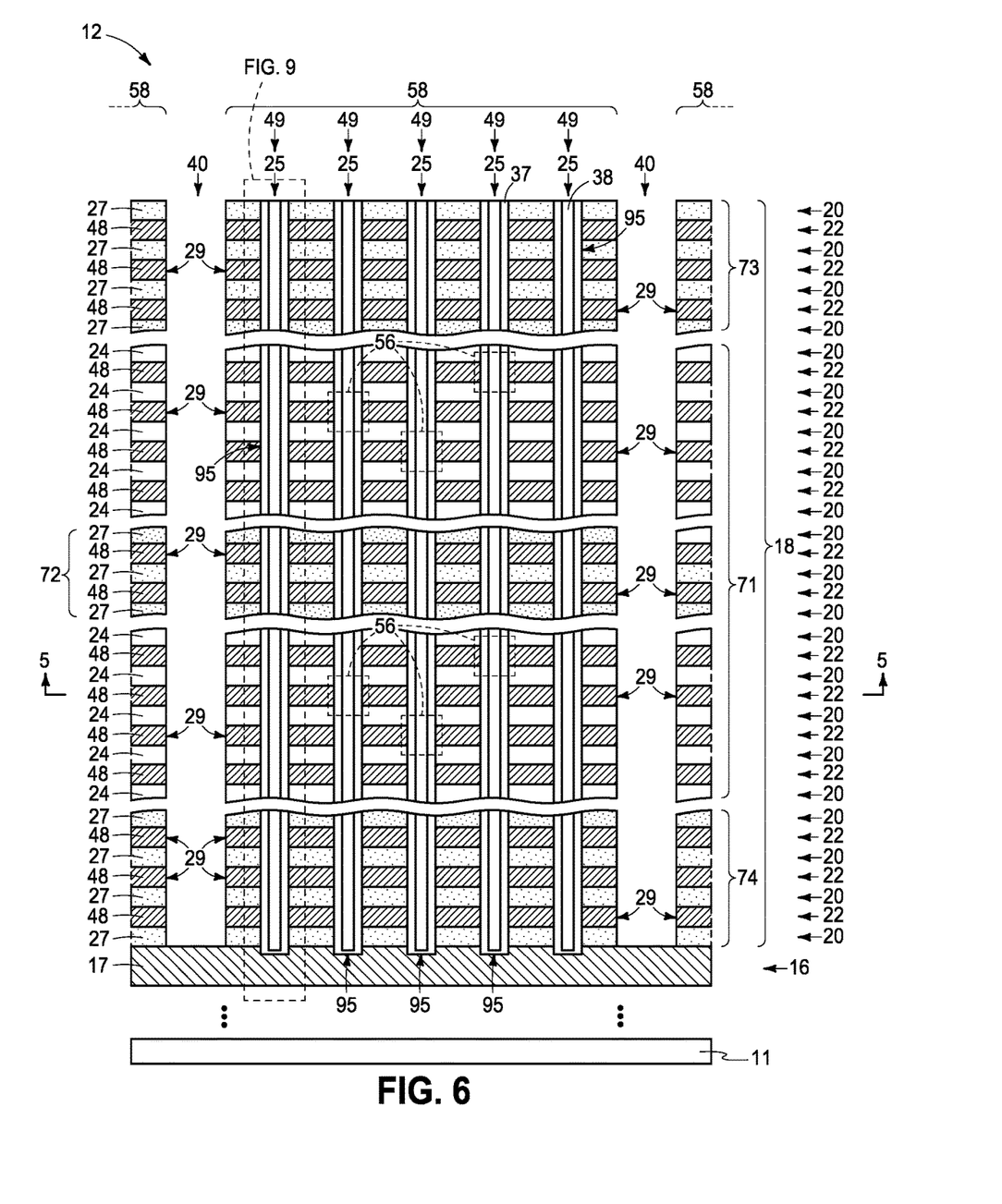
Figure 7:
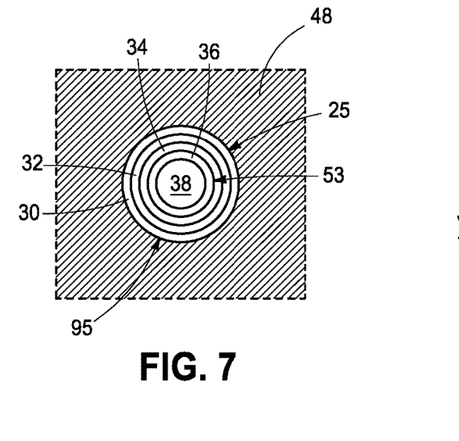
Figure 8:
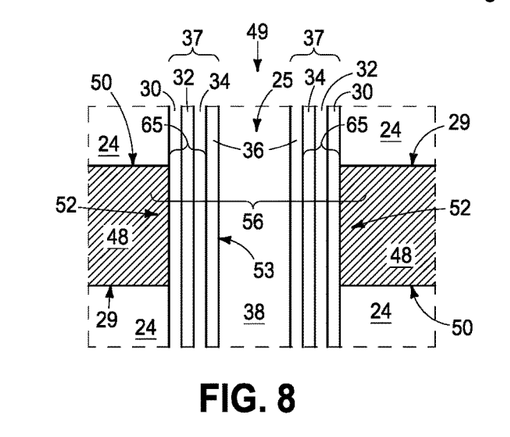
Figure 9:
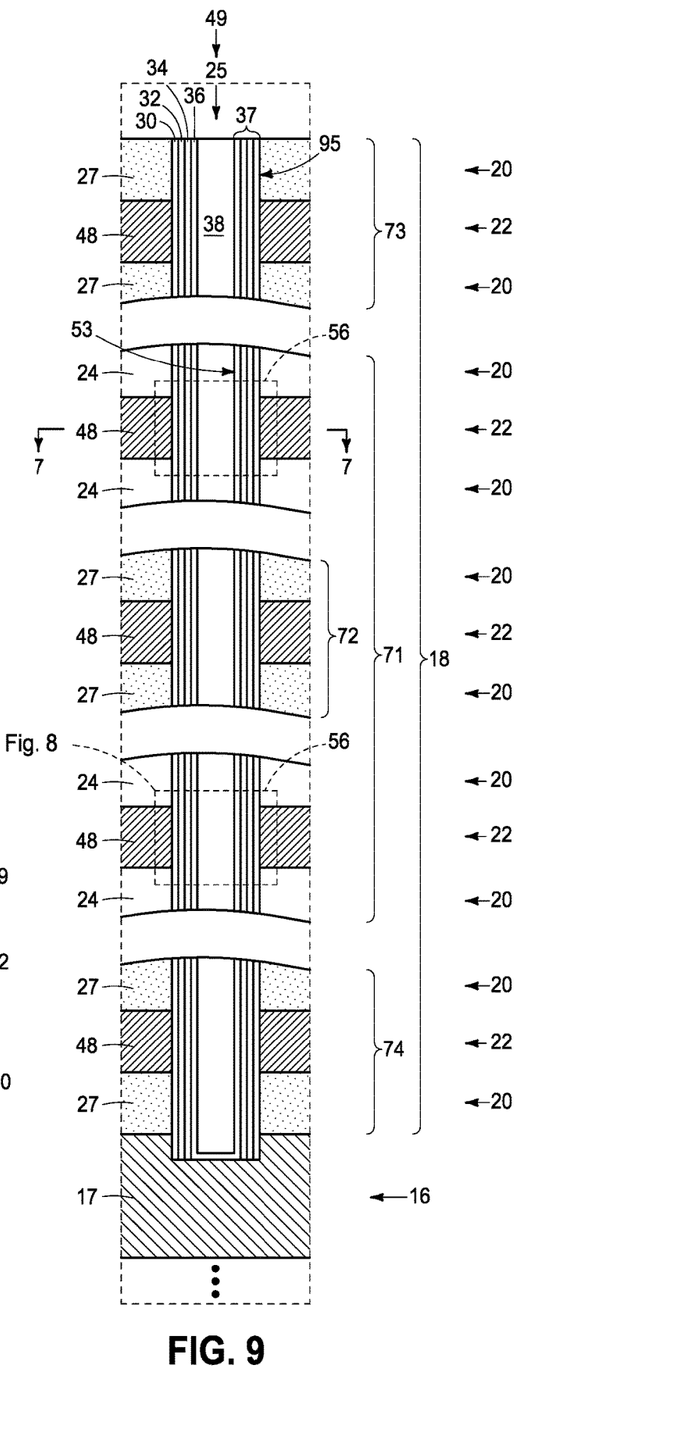

Vertical stack 18 comprises at least one of (a), (b), or (c), where:

(a): an upper region 73 directly above memory-cell region 71 comprising at least two of conductive tiers 22 (e.g., three being shown in FIG. 2). The at least two conductive tiers 22 of upper region 73 comprise upper select gates (not yet fabricated in the example gate-last processing). At least one of insulative tiers 20 in upper region 73 (all as shown) comprises insulating material (e.g., 27) that is of different composition from that of sacrificial material 24;

(b): a lower region 74 directly below memory-cell region 71 and directly above conductor tier 16. Lower region 74 comprises at least two of conductive tiers 22 (e.g., three being shown in FIG. 2). The at least two conductive tiers 22 of lower region 74 comprise lower select gates (not yet fabricated in the example gate-last processing). At least one of insulative tiers 20 in lower region 74 (all as shown) comprises insulator material (e.g., 27) that is of different composition from that of sacrificial material 24; and (c): a dummy region 72 in memory-cell region 71 comprising at least two of conductive tiers 22 (e.g., two being shown in FIG. 2) and that comprise dummy wordlines (not yet fabricated in the example gate-last processing). At least one of insulative tiers 20 in dummy region 72 (all as shown) comprises insulative material (e.g., 27) that is of different composition from that of sacrificial material 24.

The vertical stack may comprise any one of the (a), the (b), and the (c), only one of such, at least two of such, and/or all three of such (the latter being shown in the example embodiment). When more than one of the (a), the (b), and the (c) are present, the insulating, insulator, and/or insulative material may or may not be of the same composition relative one another.

In one embodiment, the insulating, insulator, or insulative material (e.g., 27) of the at least one of the (a), the (b), or the (c), respectively, comprises a silicon oxide (e.g., at least primarily silicon dioxide) containing carbon and sacrificial material 24 comprises silicon dioxide (e.g., containing less, if any, carbon than the insulating, insulator, or insulative material). In one such embodiment, the carbon is present at 100 ppm to 25 atomic percent of total of the silicon oxide and the carbon, in one embodiment at 0.1 atomic percent to 15 atomic percent of said total, and in one embodiment at 2 atomic percent to 12 atomic percent of said total. The carbon may ideally at least primarily be present in the silicon oxide as covalently bonded to silicon to achieve greater etch selectively, relative to silicon dioxide of sacrificial material 24 (referred to below) than would otherwise occur if the carbon were primarily present as interstitial carbon.

Referring to FIGS. 5-9, sacrifice material 26 (not shown) of conductive tiers 22 has been removed, for example by being isotropically etched away through trenches 40 ideally selectively relative to the other exposed materials (e.g., using liquid or vapor $H_3PO_4$ as a primary etchant where material 26 is silicon nitride). Material 26 (not shown) in conductive tiers 22 in the example embodiment has been replaced with conducting material 48, and which has thereafter been removed from trenches 40, thus forming individual conductive lines 29 (e.g., wordlines 29 in region 71, dummy wordlines 29 in region 72, upper select gates 29 in region 73, and lower select gates 29 in region 74) and elevationally-extending strings 49 of individual transistors and/or memory cells 56.

A thin insulative liner (e.g., $Al_2O_3$ and not shown) may be formed before forming conducting material 48. Approximate locations of some transistors and/or some memory cells 56 are indicated with a bracket or with dashed outlines, with transistors and/or memory cells 56 being essentially ring-like or annular in the depicted example. Alternately, transistors and/or memory cells 56 may not be completely encircling relative to individual channel openings 25 such that each channel opening 25 may have two or more elevationally-extending strings 49 (e.g., multiple transistors and/or memory cells about individual channel openings in individual conductive tiers with perhaps multiple wordlines per channel opening in individual conductive tiers, and not shown). Conducting material 48 may be considered as having terminal ends 50 corresponding to control-gate regions 52 of individual transistors and/or memory cells 56. Control-gate regions 52 in the depicted embodiment comprise individual portions of individual conductive lines 29. Materials 30, 32, and 34 may be considered as a memory structure 65 that is laterally between control-gate region 52 and channel material 36. In one embodiment and as shown with respect to the example "gate-last" processing, conducting material 48 of conductive tiers 22 is formed after forming openings 25 and/or trenches 40. Alternately, the conducting material of the conductive tiers may be formed before forming channel openings 25 and/or trenches 40 (not shown), for example with respect to "gate-first" processing.

A charge-blocking region (e.g., charge-blocking material 30) is between storage material 32 and individual control-gate regions 52. A charge block may have the following functions in a memory cell: In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells. An example charge-blocking region as shown comprises insulator material 30. By way of further examples, a charge-blocking region may comprise a laterally (e.g., radially) outer portion of the storage material (e.g., material 32) where such storage material is insulative (e.g., in the absence of any different-composition material between an insulative storage material 32 and conducting material 48). Regardless, as an additional example, an interface of a storage material and conductive material of a control gate may be sufficient to function as a charge-blocking region in the absence of any separate-composition-insulator material 30. Further, an interface of conducting material 48 with material 30 (when present) in combination with insulator material 30 may together function as a charge-blocking region, and as alternately or additionally may a laterally-outer region of an insulative storage material (e.g., a silicon nitride material 32). An example material 30 is one or more of silicon hafnium oxide and silicon dioxide.

Figure 10:
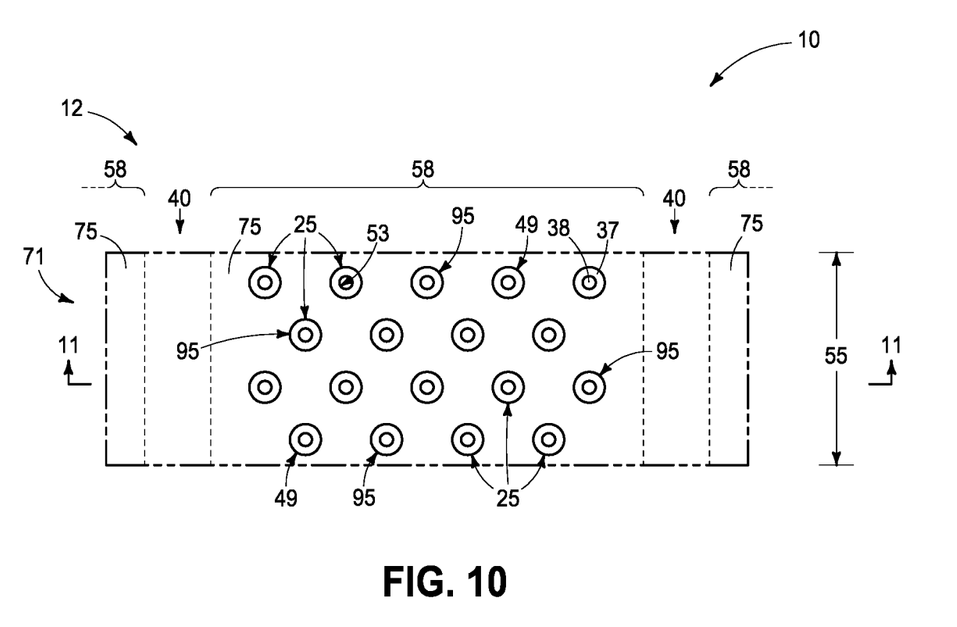
Figure 11:
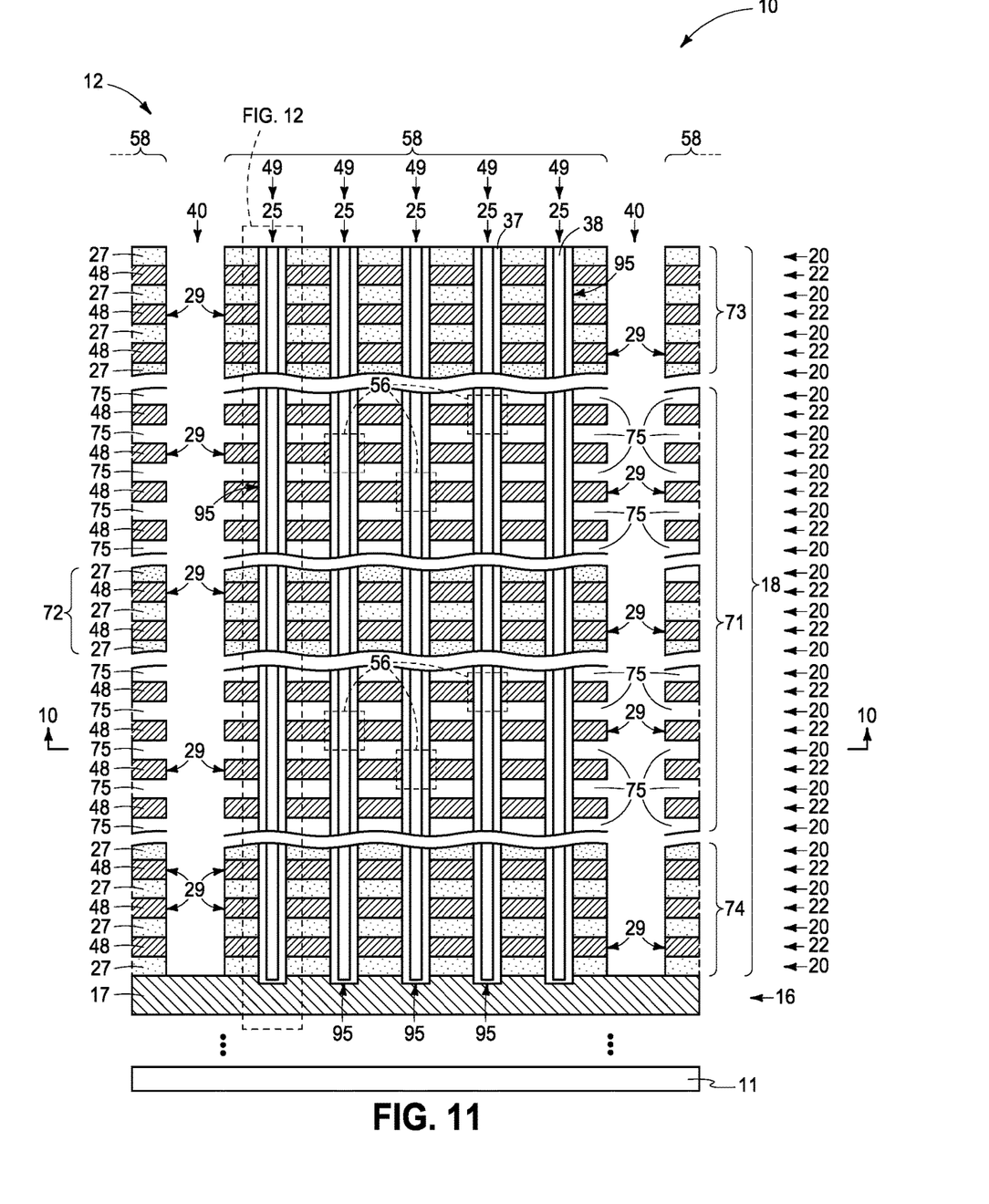
Figure 12:
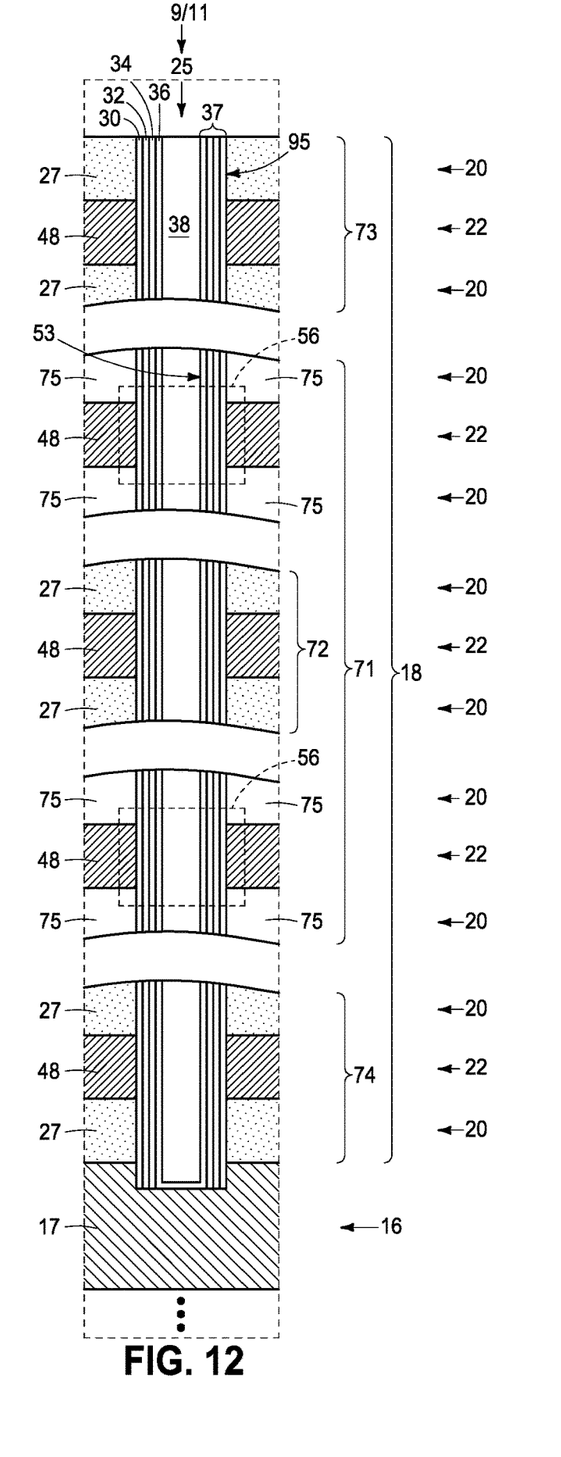

Referring to FIGS. 10-12, sacrificial material 24 (not shown) in memory-cell region 71 has been selectively etched relative to the insulating, insulator, or insulative material (e.g., 27) of the at least one of the (a), the (b), or the (c), respectively, to form void space 75 between immediately-adjacent of conductive tiers 22 in memory-cell region 71 and to not form void space between the at least two conductive tiers 22 of said at least one of the (a), the (b), or the (c). Such example etching is also shown as having been conducted selectively relative to conducting material 48. An example isotropic wet etching chemistry includes HF where insulating, insulator, or insulative material 27 comprises a silicon oxide containing carbon and sacrificial material 24 comprises silicon dioxide. The artisan is capable of selecting suitable conditions and alternate chemistries for such selective etching for other materials 24, 27, and/or 48.

Figure 13:
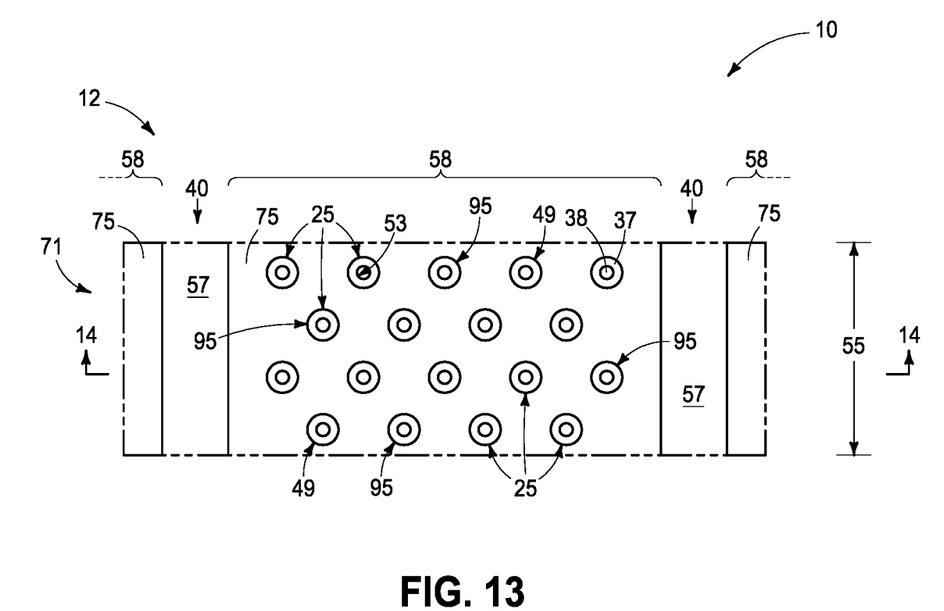
Figure 14:
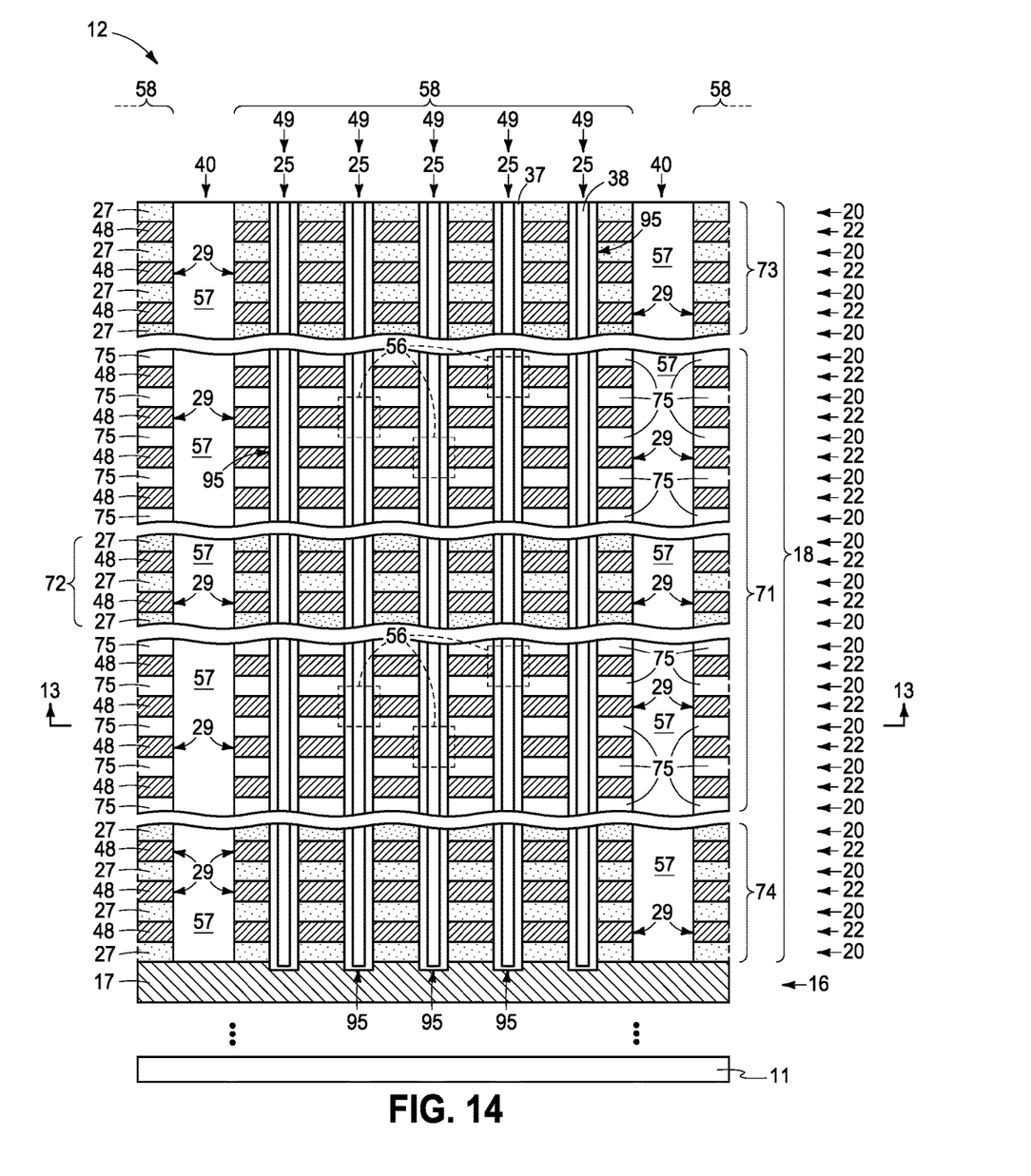

Referring to FIGS. 13 and 14, intervening material 57 has been formed in trenches 40 and thereby laterally-between and longitudinally-along immediately-laterally-adjacent memory blocks 58. Intervening material 57 may provide lateral electrical isolation (insulation) between immediately-laterally-adjacent memory blocks. Such may include one or more of insulative, semiconductive, and conducting materials and, regardless, may facilitate conductive tiers 22 from shorting relative one another in a finished circuitry construction. Example insulative materials are one or more of $SiO_2$, $Si_3N_4$, and $Al_2O_3$. Intervening material 57 may include through array vias (not shown).

Alternate embodiment constructions may result from method embodiments described above, or otherwise. Regardless, embodiments of the invention encompass memory arrays independent of method of manufacture. Nevertheless, such memory-arrays may have any of the attributes as described herein in method embodiments. Likewise, the above-described method embodiments may incorporate, form, and/or have any of the attributes described with respect to device embodiments.

In one embodiment, a memory array (e.g., 12) comprising strings (e.g., 49) of memory cells (e.g., 56) comprises a vertical stack (e.g., 18) comprising vertically-alternating insulative tiers (e.g., 22) and conductive tiers (e.g., 20) directly above a conductor tier (e.g., 16). Channel-material-string constructions (e.g., 95) of memory-cell strings (e.g., 49) extend through the insulative and conductive tiers. The channel material (e.g., 36) of the channel-material-string constructions directly electrically couples with conductor material (e.g., 17) of the conductor tier. The vertical stack comprises a memory-cell region (e.g., 71) comprising memory cells (e.g., 56). Individual of the insulative tiers in the memory-cell region laterally-outward of the channel-material-string constructions have at least a majority of their insulative matter (i.e., up to and including 100%) being void space (e.g., 75). The vertical stack comprises an upper region (e.g., 73) directly above the memory-cell region. The upper region comprises at least two of the conductive tiers and that comprise upper select gates (e.g., 29). Individual of the insulative tiers in the upper region laterally-outward of the channel-material-string constructions have at least a majority of their insulative matter being solid (e.g., solid material 27).

In one embodiment, the solid insulative matter comprises a silicon oxide (e.g., at least primarily silicon dioxide) containing carbon. In one such embodiment, the carbon is present at 10 ppm to 25 atomic percent of total of the silicon oxide and the carbon, in one embodiment at 0.1 atomic percent to 15 atomic percent of said total, and in one embodiment at 2 atomic percent to 12 atomic percent of said total.

In one embodiment, the vertical stack comprises a lower region (e.g., 74) directly below the memory-cell region and directly above the conductor tier. The lower region comprises at least two of the conductive tiers and that comprise lower select gates (e.g., 29). Individual of the insulative tiers in the lower region laterally-outward of the channel-material-string constructions have at least a majority of their insulative matter being solid (e.g., solid material 27). In one embodiment, the vertical stack comprises a dummy region (e.g., 72) in the memory-cell region comprising at least two of the conductive tiers and that comprise dummy wordlines (e.g., 29). Individual of the insulative tiers in the dummy region laterally-outward of the channel-material-string constructions have at least a majority of their insulative matter being solid (e.g., solid material 27).

Any other attribute(s) or aspect(s) as shown and/or described herein with respect to other embodiments may be used.

In one embodiment, a memory array (e.g., 12) comprising strings (e.g., 49) of memory cells (e.g., 56) comprises a vertical stack (e.g., 18) comprising vertically-alternating insulative tiers (e.g., 22) and conductive tiers (e.g., 20) directly above a conductor tier (e.g., 16). Channel-material-string constructions (e.g., 95) of memory-cell strings (e.g., 49) extend through the insulative and conductive tiers. The channel material (e.g., 36) of the channel-material-string constructions directly electrically couples with conductor material (e.g., 17) of the conductor tier. The vertical stack comprises a memory-cell region (e.g., 71) comprising memory cells (e.g., 56). Individual of the insulative tiers in the memory-cell region laterally-outward of the channel-material-string constructions have at least a majority of their insulative matter (i.e., up to and including 100%) being void space (e.g., 75). The vertical stack comprises a lower region (e.g., 74) directly below the memory-cell region and directly above the conductor tier. The lower region comprises at least two of the conductive tiers and that comprise lower select gates 29. Individual of the insulative tiers in the lower region laterally-outward of the channel-material-string constructions have at least a majority of their insulative matter being solid material 27).

Any other attribute(s) or aspect(s) as shown and/or described herein with respect to other embodiments may be used.

In one embodiment, a memory array (e.g., 12) comprising strings (e.g., 49) of memory cells (e.g., 56) comprises a vertical stack (e.g., 18) comprising vertically-alternating insulative tiers (e.g., 22) and conductive tiers (e.g., 20) directly above a conductor tier (e.g., 16). Channel-material-string constructions (e.g., 95) of memory-cell strings (e.g., 49) extend through the insulative and conductive tiers. The channel material (e.g., 36) of the channel-material-string constructions directly electrically couples with conductor material (e.g., 17) of the conductor tier. The vertical stack comprises a memory-cell region (e.g., 71) comprising memory cells (e.g., 56). Individual of the insulative tiers in the memory-cell region laterally-outward of the channel-material-string constructions have at least a majority of their insulative matter (i.e., up to and including 100%) being void space (e.g., 75). The vertical stack comprises a dummy region (e.g., 72) in the memory-cell region comprising at least two of the conductive tiers and that comprise dummy wordlines (e.g., 29). Individual of the insulative tiers in the dummy region laterally-outward of the channel-material-string constructions have at least a majority of their insulative matter being solid (e.g., solid material 27).

Any other attribute(s) or aspect(s) as shown and/or described herein with respect to other embodiments may be used.

Embodiments of the invention may enable maximizing of void space between immediately-adjacent conductive tiers in a memory-cell region and prevent or reduce formation of void space between immediately-adjacent conductive tiers in one or more of an upper select gate region, a lower select region, and a dummy wordline region.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be conductive metal material and/or conductively-doped semiconductive/semiconductor/semiconducting material. "Metal material" is any one or combination of an elemental metal, any mixture or alloy of two or more elemental metals, and any one or more metallic compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively, forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

In this document, a "dummy region" is a region that contains "dummy wordlines". A "dummy wordline" is a wordline containing functional transistor gates that are "on" in normal operation such that the transistors are switched "on" in normal operation.

CONCLUSION

In some embodiments, a method used in forming a memory array comprising strings of memory cells comprises forming a vertical stack comprising alternating insulative tiers and conductive tiers directly above a conductor tier. Channel-material strings extend through the insulative tiers and the conductive tiers and directly electrically couple with conductor material of the conductor tier. The vertical stack comprises a memory-cell region comprising memory cells. Individual of the insulative tiers in the memory-cell region comprise sacrificial material. The vertical stack comprises at least one of (a), (b), and (c), where (a): an upper region directly above the memory-cell region comprising at least two of the conductive tiers, the at least two conductive tiers in the upper region comprising upper select gates, at least one of the insulative tiers in the upper region comprising insulating material that is of different composition from that of the sacrificial material; (b): a lower region directly below the memory-cell region and directly above the conductor tier, the lower region comprising at least two of the conductive tiers, the at least two conductive tiers in the lower region comprising lower select gates, at least one of the insulative tiers in the lower region comprising insulator material that is of different composition from that of the sacrificial material; and (c): a dummy region in the memory-cell region comprising at least two of the conductive tiers and that comprise dummy wordlines, at least one of the insulative tiers in the dummy region comprising insulative material that is of different composition from that of the sacrificial material. The sacrificial material in the memory-cell region is etched selectively relative to the insulating, insulator, or insulative material of the at least one of the (a), the (b), or the (c), respectively, to form void space between immediately-adjacent of the conductive tiers in the memory-cell region and to not form void space between the at least two conductive tiers of said at least one of the (a), the (b), or the (c).

In some embodiments, a memory array comprising strings of memory cells comprises a vertical stack comprising vertically-alternating insulative tiers and conductive tiers directly above a conductor tier. Channel-material-string constructions of memory-cell strings extend through the insulative and conductive tiers. The channel material of the channel-material-string constructions directly electrically couples with conductor material of the conductor tier. The vertical stack comprising a memory-cell region comprises memory cells. Individual of the insulative tiers in the memory-cell region laterally-outward of the channel-material-string constructions have at least a majority of their insulative matter being void space. The vertical stack comprises an upper region directly above the memory-cell region. The upper region comprises at least two of the conductive tiers and that comprise upper select gates. Individual of the insulative tiers in the upper region laterally-outward of the channel-material-string constructions have at least a majority of their insulative matter being solid.

In some embodiments, a memory array comprising strings of memory cells comprises a vertical stack comprising vertically-alternating insulative tiers and conductive tiers directly above a conductor tier. Channel-material-string constructions of memory-cell strings extend through the insulative and conductive tiers. The channel material of the channel-material-string constructions directly electrically couples with conductor material of the conductor tier. The vertical stack comprising a memory-cell region comprises memory cells. Individual of the insulative tiers in the memory-cell region laterally-outward of the channel-material-string constructions have at least a majority of their insulative matter being void space. The vertical stack comprises a lower region directly below the memory-cell region and directly above the conductor tier. The lower region comprises at least two of the conductive tiers and that comprise lower select gates. Individual of the insulative tiers in the lower region laterally-outward of the channel-material-string constructions have at least a majority of their insulative matter being solid.

In some embodiments, a memory array, comprising strings of memory cells comprises a vertical stack comprising vertically-alternating insulative tiers and conductive tiers directly above a conductor tier. Channel-material-string constructions of memory-cell strings extend through the insulative and conductive tiers. The channel material of the channel-material-string constructions directly electrically couples with conductor material of the conductor tier. The vertical stack comprising a memory-cell region comprises memory cells. Individual of the insulative tiers in the memory-cell region laterally-outward of the channel-material-string constructions have at least a majority of their insulative matter being void space. The vertical stack comprising a dummy region in the memory-cell region comprises at least two of the conductive tiers and that comprise dummy wordlines. Individual of the insulative tiers in the dummy region laterally-outward of the channel-material-string constructions have at least a majority of their insulative matter being solid.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in forming a memory array comprising strings of memory cells, comprising:
    forming a vertical stack comprising alternating insulative tiers and conductive tiers directly above a conductor tier, channel-material strings extending through the insulative tiers and the conductive tiers and that directly electrically couple with conductor material of the conductor tier, the vertical stack comprising a memory-cell region comprising memory cells, individual of the insulative tiers in the memory-cell region comprising sacrificial material;
    the vertical stack comprising at least one of (a), (b), and (c), where:
        (a): an upper region directly above the memory-cell region comprising at least two of the conductive tiers, the at least two conductive tiers in the upper region comprising upper select gates, at least one of the insulative tiers in the upper region comprising insulating material that is of different composition from that of the sacrificial material, the insulating material being directly above and directly below immediately-vertically-adjacent of the upper select gates;
        (b): a lower region directly below the memory-cell region and directly above the conductor tier, the lower region comprising at least two of the conductive tiers, the at least two conductive tiers in the lower region comprising lower select gates, at least one of the insulative tiers in the lower region comprising insulator material that is of different composition from that of the sacrificial material, the insulator material being directly above and directly below immediately-vertically-adjacent of the lower select gates; and
        (c): a dummy region in the memory-cell region comprising at least two of the conductive tiers and that comprise dummy wordlines, at least one of the insulative tiers in the dummy region comprising insulative material that is of different composition from that of the sacrificial material, the insulative material being directly above and directly below immediately-vertically-adjacent of the dummy wordlines; and
    etching the sacrificial material in the memory-cell region selectively relative to the insulating, insulator, or insulative material of the at least one of the (a), the (b), or the (c), respectively, to form void space between immediately-adjacent of the conductive tiers in the memory-cell region and to not form void space between the at least two conductive tiers of said at least one of the (a), the (b), or the (c).

2. The method of claim 1 wherein the vertical stack comprises only one of the (a), the (b), and the (c).

3. The method of claim 1 wherein the vertical stack comprises at least two of the (a), the (b), and the (c).

4. The method of claim 1 wherein the vertical stack comprises all three of the (a), the (b), and the (c).

5. The method of claim 1 wherein the vertical stack comprises the (a).

6. The method of claim 1 wherein the vertical stack comprises the (b).

7. The method of claim 1 wherein the vertical stack comprises the (c).

8. The method of claim 1 wherein the insulating, insulator, or insulative material of the at least one of the (a), the (b), or the (c), respectively, comprises a silicon oxide containing carbon and the sacrificial material comprises silicon dioxide.

9. The method of claim 8 wherein the carbon is present at 100 ppm to 25 atomic percent of total of the silicon oxide and the carbon.

10. The method of claim 9 wherein the carbon is present at 0.1 atomic percent to 15 atomic percent of the total of the silicon oxide and the carbon.

11. The method of claim 10 wherein the carbon is present at 2 atomic percent to 12 atomic percent of the total of the silicon oxide and the carbon.

12. The method of claim 1 wherein,
    at least some of the conductive tiers in the memory-cell region initially comprise sacrifice material that is of different composition from that of the sacrificial material and from that of the at least one of the insulating, insulator, or insulative material of the at least one of the (a), the (b), or the (c), respectively; and
    replacing the sacrifice material with conductive material prior to said etching.

\* \* \* \* \*